(12) United States Patent
Won et al.

(10) Patent No.: US 7,959,987 B2
(45) Date of Patent: Jun. 14, 2011

(54) FUEL CELL CONDITIONING LAYER

(75) Inventors: Tae Kyung Won, San Jose, CA (US);
Robert Bachrach, Burlingame, CA (US); John M. White, Hayward, CA (US); Wendell T. Blonigan, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1442 days.

(21) Appl. No.: 11/292,225

(22) Filed: Nov. 30, 2005

(65) Prior Publication Data
US 2006/0134496 A1 Jun. 22, 2006

Related U.S. Application Data

(60) Provisional application No. 60/635,986, filed on Dec. 13, 2004.

(51) Int. Cl.
*C23C 16/24* (2006.01)
*C23C 16/34* (2006.01)
*C23C 16/513* (2006.01)

(52) U.S. Cl. . 427/578; 427/579; 427/115; 427/255.393; 427/255.394

(58) Field of Classification Search .................. 428/34; 427/115, 578, 579, 255.393, 255.394; 118/723 R
See application file for complete search history.

(56) References Cited

U.S. PATENT DOCUMENTS

| | | | |
|---|---|---|---|
| 5,600,460 A * | 2/1997 | Yamamoto et al. | 349/54 |
| RE36,573 E * | 2/2000 | Barrow et al. | 427/376.1 |
| 6,203,936 B1 | 3/2001 | Cisar et al. | |
| 6,399,177 B1 | 6/2002 | Fonash et al. | |
| 6,426,161 B1 | 7/2002 | Cisar et al. | |
| 6,733,911 B2 | 5/2004 | Kawahara | |
| 6,811,918 B2 | 11/2004 | Blunk et al. | |
| 6,821,661 B2 | 11/2004 | Haridoss et al. | |
| 6,827,747 B2 | 12/2004 | Lisi et al. | |
| 6,828,055 B2 | 12/2004 | Kearl | |
| 6,921,464 B2 | 7/2005 | Krasnov et al. | |
| 7,097,886 B2 * | 8/2006 | Moghadam et al. | 427/569 |
| 2002/0028365 A1 | 3/2002 | Hirabayashi | |

(Continued)

FOREIGN PATENT DOCUMENTS

EP 1 176 651 A2 1/2002

(Continued)

OTHER PUBLICATIONS

International Search Report and Written Opinion of the International Searching Authority mailed May 28, 2008 (PCT/US05/43912.
European Search Report 07781877.1 dtd Dec. 7, 2009.
Summary of Official Letter dated Jun. 3, 2010 for Taiwan Patent Application No. 94144157 and Search Report.

*Primary Examiner* — Jerry Lorengo
*Assistant Examiner* — Jared Wood
(74) *Attorney, Agent, or Firm* — Patterson & Sheridan, L.L.P.

(57) ABSTRACT

A method and apparatus for depositing a material layer to treat and condition a substrate, such as a fuel cell part, is described. The method includes depositing a hydrophilic material layer on a portion of the surface of the substrate in a process chamber from a mixture of precursors of the hydrophilic material layer. In addition, the method includes reducing a fluid contact angle of the substrate surface. The hydrophilic material layer comprises a wet etch rate of less than about 0.03 Å/min in the presence of about 10 ppm of hydrofluoric acid in water. The material layer can be used to condition various parts of a fuel cell useful in applications to generate electricity.

30 Claims, 5 Drawing Sheets

U.S. PATENT DOCUMENTS

| | | |
|---|---|---|
| 2002/0085967 A1 | 7/2002 | Yokota |
| 2002/0115269 A1* | 8/2002 | Harshbarger et al. ......... 438/482 |
| 2002/0136686 A1 | 9/2002 | Takahashi |
| 2002/0137276 A1* | 9/2002 | Park ............................ 438/241 |

FOREIGN PATENT DOCUMENTS

| | | |
|---|---|---|
| JP | 2005 138204 | 6/2005 |
| WO | WO 00/22689 | 4/2000 |
| WO | WO 03/026036 | 3/2003 |

* cited by examiner

FUEL CELL CONDITIONING LAYER

CROSS-REFERENCE TO RELATED APPLICATIONS

This application claims benefit of U.S. provisional patent application Ser. No. 60/635,986, filed Dec. 13, 2004, which is herein incorporated by reference.

BACKGROUND OF THE INVENTION

1. Field of the Invention

Embodiments of the present invention generally relate to the deposition of thin films. More particularly, this invention relates to a process and apparatus for depositing a thin film onto a substrate surface and conditioning the substrate surface.

2. Description of the Related Art

Developing environmentally friendly energy sources have gained significant interest recently in various industries related to the generation of power and electricity. Various types of fuel cells can be used to directly produce electricity for a number of applications, such as portable electronics, cell phones, wireless devices, PDAs, cameras, portable players, computer notebooks, mobile vehicles (e.g., cars, trucks, trains, etc.), stationary large size energy equipment, residential electricity and others. Since semiconductor machining technology can be easily utilized in fuel cell manufacturing, efficient production of electricity by fuel cells is feasible.

A fuel cell is an electrochemical device in which a gaseous or liquid fuel reacts with an oxidant to produce electricity. Generally, an electrolyte is sandwiched by two electrodes, an anode and a cathode, to form a fuel cell unit. A fuel, such as pure hydrogen or hydrogen reformed from any hydrocarbon fuel, is fed into the anode to be oxidized into a proton and an electron. An oxidant, such as air or oxygen, is flowed into the cathode to react with the proton which has passed through the electrolyte and, in some cases, through a proton-permeable membrane. The electron forms a separate current that can be utilized to generate electricity before returning to the cathode to be reunited with the proton and the oxidant, resulting in by-products, such as heat and water. Each fuel cell unit is stacked or arranged together to form a fuel cell stack or module. A number of modules or fuel cell stacks are piled, and electrical terminals, electrical insulators and end plates are disposed at opposite ends of the pile of modules to collectively produce electricity.

The essentials of a fuel cell are generally simple, leading to highly reliable and long-lasting electricity/energy generating applications. Fuel cells are also highly efficient, converting hydrogen fuel into useful energy at an efficiency rate as high as 60 percent, as compared to about 35 percent for combustion gas engines or alkaline batteries. Further, the by-product of the main fuel cell reaction, when hydrogen is the fuel, is pure water, which means the carbon dioxide ($CO_2$) emission of a fuel cell is low and can be essentially zero emission. Also, fuel cells are very quiet, even those with extra equipments (e.g., fuel pump, air pump, and thermal control systems, etc.), making them suitable for both portable power applications and for local power generation.

Generally, a fuel cell stack uses a number of conductive plates, placed between adjacent fuel cells in a fuel cell stack to separate each fuel cell. The conductive plates usually incorporate flow channels or grooves for feeding and moving any fuel gas, oxidant or fluid through the fuel cell. The conductive plates may be made of a metal or a conductive polymer, such as a carbon-filled composite. Each conductive plate includes one side for flowing fuel gases or oxidant gases. The other side of the conductive plate generally contains cooling channels or conduits, which are mated with the cooling channels from an adjacent fuel cell in a fuel cell stack to form into a mated conductive plate having an internal cylindrical path for flowing coolants to move the heat and water produced from the chemical reactions at an anode and/or a cathode away from the fuel cell stack. A mated conductive plate thus includes one side to serve as an anode for one fuel cell and the other side to act as a cathode for an adjacent fuel cell. Therefore, the conductive plates placed between adjacent fuel cells in a fuel cell stack are also called a bipolar plate or a separator plate and the conductive plates placed at both ends of a fuel cell stack are also called end plates.

The electrolyte plays a key role in a fuel cell to carry protons from one electrode, the anode, to the other electrode the cathode. The electrolyte includes various types of organic and inorganic chemicals and, thus, different types of fuel cells are formed depending on the types of chemicals used. In addition, the electrolyte may include a membrane, such as a polymer membrane for a direct methanol fuel cell (DMFC) or an immobilized liquid molten carbonate for a molten carbonate fuel cell (MCFC). One type of fuel cell, a proton exchange membrane fuel cell (PEMFC), uses a thin proton exchange membrane with both sides of the surfaces coated with different catalysts, which accelerates the different chemical reactions at the anode and the cathode. The membrane is sandwiched by two microporous conductive layers (which function as the gas diffusion layers and current collectors) to separate the hydrogen fuel from the anode and the oxidant from the cathode and thus forming a membrane electrode assembly (MEA).

The MEA must permit only the proton to pass between the anode and the cathode. If free electrons or other substances travel through the MEA, they would disrupt the chemical reactions and short circuit part of the current. Further, in order for a fuel cell to operate properly with high electrical output and reliability, the gas and fluids must be moved through the surface of parts, channels, conduits, passages, grooves and/or holes inside the fuel cell without interruption under a wide variety of operating conditions. As such, the surface properties of any fuel cell parts must be conditioned to facilitate and enable this movement. In addition, various parts of a fuel cell stack or module should provide a surface with good contact to electrolyte, current or any gas, fluid present in the fuel cell stack.

For example, the surface of fuel cell parts should provide a low fluid contact angle to the electrolyte as well as high conductivity for current to go through. The surfaces of fuel cell parts may need to be conditioned to provide good electrical contact such that contact landing areas may not need to be masked. In addition, the surface of fuel cell parts should withstand by-product heat and cycles of temperature variation between low temperatures (e.g., −40° C.) and high temperatures (e.g., 100° C.). Furthermore, conditioning the surfaces of fuel cell parts can protect the parts from the attack of acid, water ($H_2O$), oxygen ($O_2$) and any other chemicals in the electrolyte to ensure long part lifetime and long term reliable operation. Surfaces conditioned by a thin film or coating should be resistant to peeling or swelling inside the fuel cell environment. Also, an acidic environment in the fuel cell may be created from the release of fluorine present in the membrane electrode assembly (MEA), a fuel cell part may need to be conditioned to sustain etching by such a hydrofluoric acid (HF)-containing environment.

Thus, there is still a need for methods and apparatus for conditioning a surface of a substrate, such as a fuel cell part, with improved fluid contact angle and low acid etch rate to protect the substrate.

SUMMARY OF THE INVENTION

Embodiments of the invention generally provide a method and apparatus for depositing a conditioning film onto a substrate. In one embodiment, a method for treating a surface of a substrate useful in a fuel cell includes depositing a hydrophilic material layer from a mixture of precursors for the hydrophilic material layer onto a portion of the surface of the substrate in a process chamber. The substrate may comprise a carbon composite material. The hydrophilic material layer is deposited to a thickness to enhance resistance to acid corrosion with a wet etch rate of less than about 0.03 Å/min in the presence of about 10 ppm of hydrofluoric acid in water.

In another embodiment, a method is provided for treating a surface of a substrate, which has a high fluid contact angle. The method includes placing the substrate in a process chamber, generating a plasma inside the process chamber, and depositing a material layer onto a portion of the surface of the substrate from a mixture of precursors for the material layer to reduce the fluid contact angle of the substrate surface. In one aspect, the material layer is deposited to a thickness to enhance resistance to acid corrosion with a wet acid etch rate of less than about 0.03 Å/min in the presence of about 10 ppm of hydrofluoric acid in water. The material layer may be deposited on a portion of a surface of a substrate before or after the substrate surface is patterned. In one aspect, the material layer is deposited on a patterned substrate having topographical features thereon with good step coverage over the features and good uniformity of about 10% or higher over the surface of the substrate.

In yet another embodiment, a method for conditioning a fuel cell part with a material layer is provided. The method includes placing the fuel cell part in a process chamber and generating a plasma inside the process chamber. The surface of the fuel cell part has a fluid contact angle and the material layer is deposited onto a portion of the surface of the fuel cell part from a mixture of precursors for the material layer to reduce the fluid contact angle of the surface of the fuel cell part.

Another method for conditioning a fuel cell part with a material layer, includes placing the fuel cell part in a process chamber, generating a plasma inside the process chamber, and depositing the material layer onto a portion of the surface of the fuel cell part from a mixture of precursors for the material layer such that the material layer comprises a wet etch rate of less than about 0.03 Å/min in the presence of about 10 ppm of hydrofluoric acid in water. In one embodiment, both sides of the fuel cell part are conditioned with a material layer one side at a time or simultaneously.

In one aspect of the invention, the deposited material layer may be a low resistivity material. For example, the deposited material layer may exhibit a resistivity of less than about 100 $\Omega$-cm, such as less than about 10 $\Omega$-cm, on the surface of a carbon composite substrate. In another aspect, the deposited material layer contains high contact angle to a fluid (e.g., water), good adhesion to the substrate, and no dissolution, after long term exposure to acidic conditions.

In one embodiment, a plasma enhanced chemical vapor deposition method and an apparatus to deposit a material layer on a substrate surface at low temperature of about 200° C. or less are provided. The deposited material layer contains a small fluid contact angle, low resistivity and low wet etch rate to acid on a substrate surface. In one aspect of the invention, the material layer can be an amorphous silicon layer, a phosphorus-doped amorphous silicon layer, a microcrystal silicon layer, and a silicon nitride layer. The material layer can be deposited using precursors including combinations of one or more of a silicon-containing gas, a nitrogen-containing gas, a phosphorus-containing gas and a hydrogen-containing gas.

In another embodiment, a phosphorus doped amorphous silicon layer is deposited on a substrate surface at low source power of about 300 W or less using plasma enhanced chemical vapor deposition. In one aspect, the phosphorus doped amorphous layer is deposited using precursors including a silicon-containing gas and a low flow rate of about 500 sccm or less of a phosphorus-containing gas.

In still another embodiment, a silicon nitride layer is deposited using precursors including a silicon-containing gas, a nitrogen-containing gas, and hydrogen gas ($H_2$). In one aspect, a hydrogen gas ($H_2$) precursor being flowed at a high flow rate of about 3000 sccm or more is used for depositing the silicon nitride layer.

Furthermore, apparatuses and deposition systems for treating a surface of a substrate, fabricating a fuel cell, and/or conditioning a fuel cell part are provided. An apparatus for treating a substrate useful in a fuel cell includes a chamber body, a substrate processing region adapted to processing one or more substrates having high fluid contact angle, such as a carbon composite material, one or more gas sources adapted to deliver a mixture of precursors comprising one or more of a silicon-containing compound, phosphorus-containing compound, a nitrogen-containing containing, and hydrogen gas ($H_2$). into the substrate processing region, a substrate support assembly, and a gas distribution assembly connected to one or more power sources adapted to sustain a plasma in the substrate processing region from the mixture of precursors and deposit the hydrophilic material layer onto a portion of the surface of the substrate. For example, the hydrophilic material layer is deposited to a thickness to enhance resistance to acid corrosion with a wet etch rate of less than about 0.03 Å/min in the presence of about 10 ppm of hydrofluoric acid in water.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention generally relates to a method of improving the surface property of a substrate. The invention describes treating or conditioning a substrate surface by depositing a material layer with good adhesion to the substrate, small fluid contact angle or hydrophilic property, low resistivity (high conductivity) for current to go through and resistant to acid etching and resistant to swelling in acidic environments which causes the material layer to peel or flake off the surface of the substrate. The substrate may be, for example, a fuel cell part, a conductive plate, a separator plate, a bipolar plate or an end plate, among others. However, the invention is equally applicable to other types of substrates. Substrates of the invention can be of any shape (e.g., circular, square, rectangle, polygonal, etc.) and size. Also, the type of substrate is not limiting and can be any substrate comprised of a material of carbon-containing polymer, composite, metal, plastic, semiconductor, glass or other suitable materials, where the substrate's surface fluid contact angle and resistance to wet etch conditions need to be improved while maintaining good conductivity (low resistivity).

Figure 1:
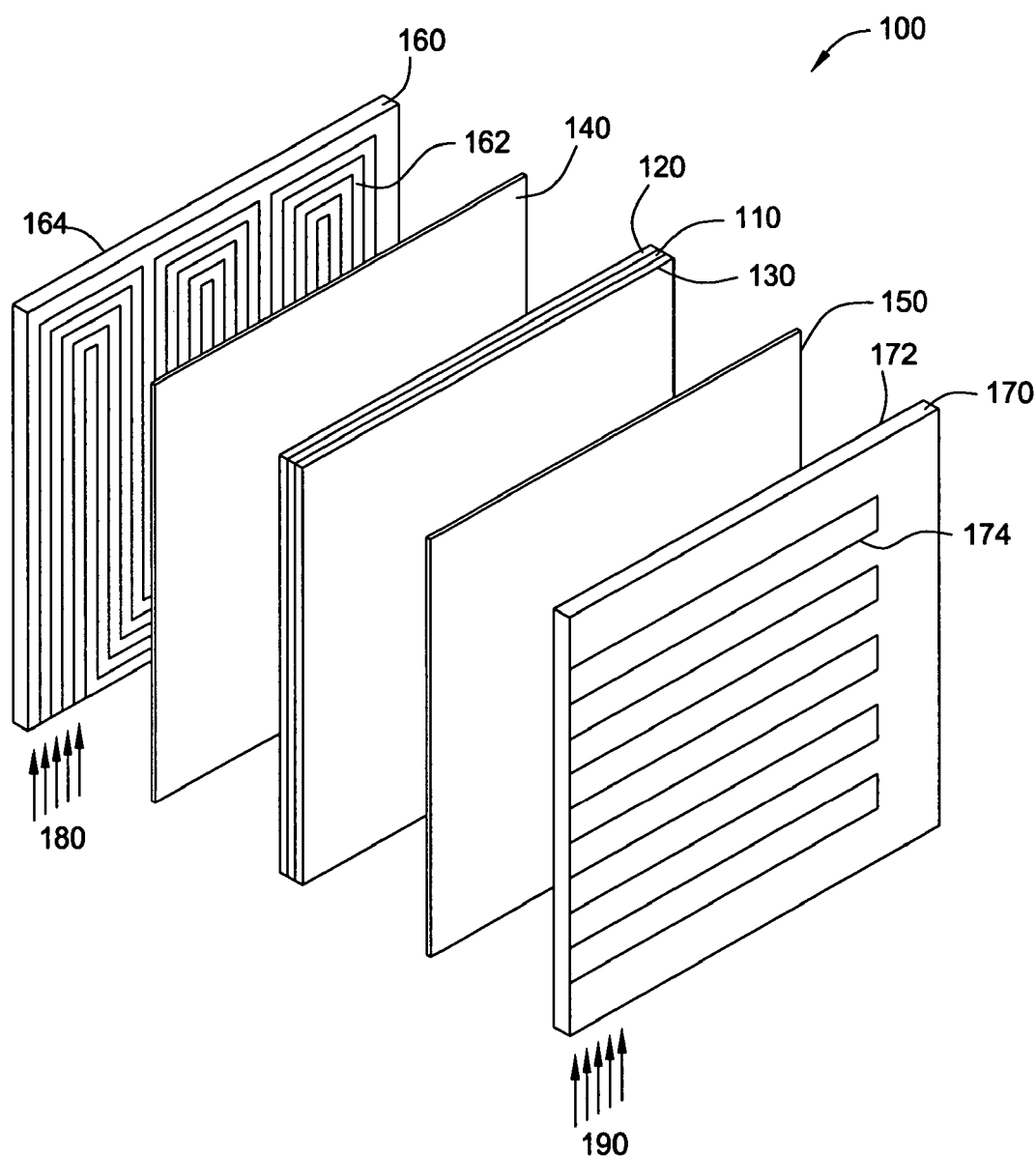
FIG. 1 depicts a schematic view of a fuel cell unit.

FIG. 1 illustrates a schematic view of an exemplary fuel cell unit 100. A membrane 110 is generally coated with an anode catalyst 120 and a cathode catalyst 130 to form a membrane electrode assembly (MEA). The membrane 110 can be made from ion exchange resins or a polymer material. For example, an ionic perfluoronated sulfonic acid polymer membrane, such as Nafion™, available from the E.I. DuPont de Nemeours & Co. Other suitable membrane materials include Gore Select™, sulphonated fluorocarbon polymers, the polybenzimidazole (PBI) membrane (available from Celanese Chemicals, Dallas, Tex.), polyether ether ketone (PEEK) membranes and other materials. Various suitable catalyst formulations for the cathode catalyst 120 and the anode catalyst 130 are known in the art and are generally platinum-based with very finely divided catalytic particles supported on internal and external surfaces of a carbon binder, such as a polytetrafluoroethylene (PTFE) binder.

The fuel cell unit 100 further includes an anode conductive gas diffusion layer (GDL) 140 and a cathode conductive gas diffusion layer (GDL) 150 on both sides of the membrane electrode assembly to serve as primary current collectors. The conductive gas diffusion layers are porous and gas-permeable and are generally made from a paper or cloth-based carbon fibers, graphite materials or finely-meshed noble metal screen, foams, among other materials known in the art.

A pair of gas impermeable, non-porous, electrically conductive plates, such as an anode separator plate 160 and a cathode separator plate 170, is sandwiched between the MEA-primary current collectors to serve as secondary current collectors for conducting current between adjacent fuel cells and at the ends of a fuel cell stack. One side of the anode separator plate 160 contains a flow field 162 that distributes and routes gaseous reactants, such as $H_2$ and other fuel gases, to the surface of the anode conductive gas diffusion layer 140, facing the anode side of the MEA. One side of the cathode separator plate 170 in the fuel cell unit 100 contains a flow field 172 that distributes and routes gaseous reactants, such as $O_2$, air, and other oxidants, to the surface of the cathode conductive gas diffusion layer 150, facing the cathode side of the MEA. These flow fields 162, 172 generally include a plurality of flow channels, grooves, conduits, features through which the gaseous reactants can flow between gas supplies 180, 190 and gas exhausts (not shown). The area between the plurality of flow channels are generally called land areas which contact the primary current collector. The other sides of the anode and cathode separator plates 160 and 170 generally contain cooling channels 164 and 174 or conduits for flowing a coolant. Typically, cooling channels from two conductive plates are mated together to form a coolant path to dissipate heat, water and other reaction by-products away from a fuel cell stack. The mated conductive plates become a separator plate or a bipolar plate to be placed between the anode of one fuel cell and a cathode of an adjacent fuel cell and, thus, the bipolar plate can be made out of one or more conductive plates. Alternatively, a bipolar plate can be made from one plate having cooling channels therein. In general, a bipolar plate includes one side for flowing a fuel gas through the flow field 162 and other side for flowing an oxidant through the flow field 172. Reactant gases from each side of the bipolar plate may pass along the flow fields 162, 172 and diffuse through the gas diffusion layers 140, 150 to reach the MEA.

The separator plate or bipolar plate provides electrical contact between the anodes and cathodes of neighboring fuel cells while preventing the hydrogen and oxygen reactant gases from mixing. A separator plate can be formed of a suitable metal alloy, such as stainless steel or aluminum protected with a corrosion-resistant conductive coating for enhancing the transfer of thermal and electrical energy. In addition, a separator plate can be made of a conductive polymer or a carbon-filled composite. The carbon composite material provides the adequate electrical and thermal conductivity to be used as a separator. For example, a high carbon loading composite with graphite powder in the range of 70% to 90% by volume can be used. However, due to the high graphite loading and the high specific gravity of graphite, these composite materials may be inherently brittle and dense, resulting in cracking and breaking.

Moreover, the separator plate is continuously exposed to an acidic and polarized environment and to pressurized air and hydrogen. Thus, the separator plate must be resistant to such a hostile environment in the fuel cell. For example, the electrolyte of the fuel cell is generally in an environment containing hydrofluoric acid (HF), which is a good etchant for many materials. The hydrofluoric acid (HF) may be generated from combing protons ($H^+$) and a small amount of fluorine ions ($F^-$) released into the electrolyte since the membrane electrode assembly are generally made of fluorine (F)-containing materials and protons are produced at the anode by converting a fuel gas, such as a hydrogen gas, into protons ($H^+$) and electrons.

In one embodiment, the invention includes a process for conditioning various parts of a fuel cell by depositing a thin film having a consistent set of surface properties to promote the proper flow of gas and fluids through a fuel cell device. In addition, the deposited thin film resists dissolution or etching in acidic conditions, e.g., a diluted hydrofluoric acid (HF) environment, to provide high reliability of the fuel cell and long part lifetime. The thin film may be deposited for conditioning/treating any parts of a fuel cell, such as a conductive plate, separator plate, bipolar plate or end plate, among others.

In another embodiment, parts of various types of fuel cells can be conditioned with a thin material layer such that the surface becomes more hydrophilic to water and/or the electrolyte with reduced fluid contact angle to water and/or the electrolyte and good surface conductive properties. Other types of fuel cells includes solid oxide fuel cell (SOFC), molten carbonate fuel cell (MCFC), phosphoric acid fuel cell (PAFC), direct methanol fuel cell (DMFC), polymer electrolyte membrane fuel cell (PEMFC), alkaline fuel cell (AFC), among others.

The invention is illustratively described below in reference to a plasma enhanced chemical vapor deposition system configured to process various types of substrates, such as various parallel-plate radio-frequency (RF) plasma enhanced chemical vapor deposition (PECVD) systems for various substrate sizes, available from AKT, a division of Applied Materials, Inc., Santa Clara, Calif. However, it should be understood that the invention has utility in other system configurations, such as other chemical vapor deposition systems and any other film deposition systems, including those systems configured to process round substrates.

Figure 2:
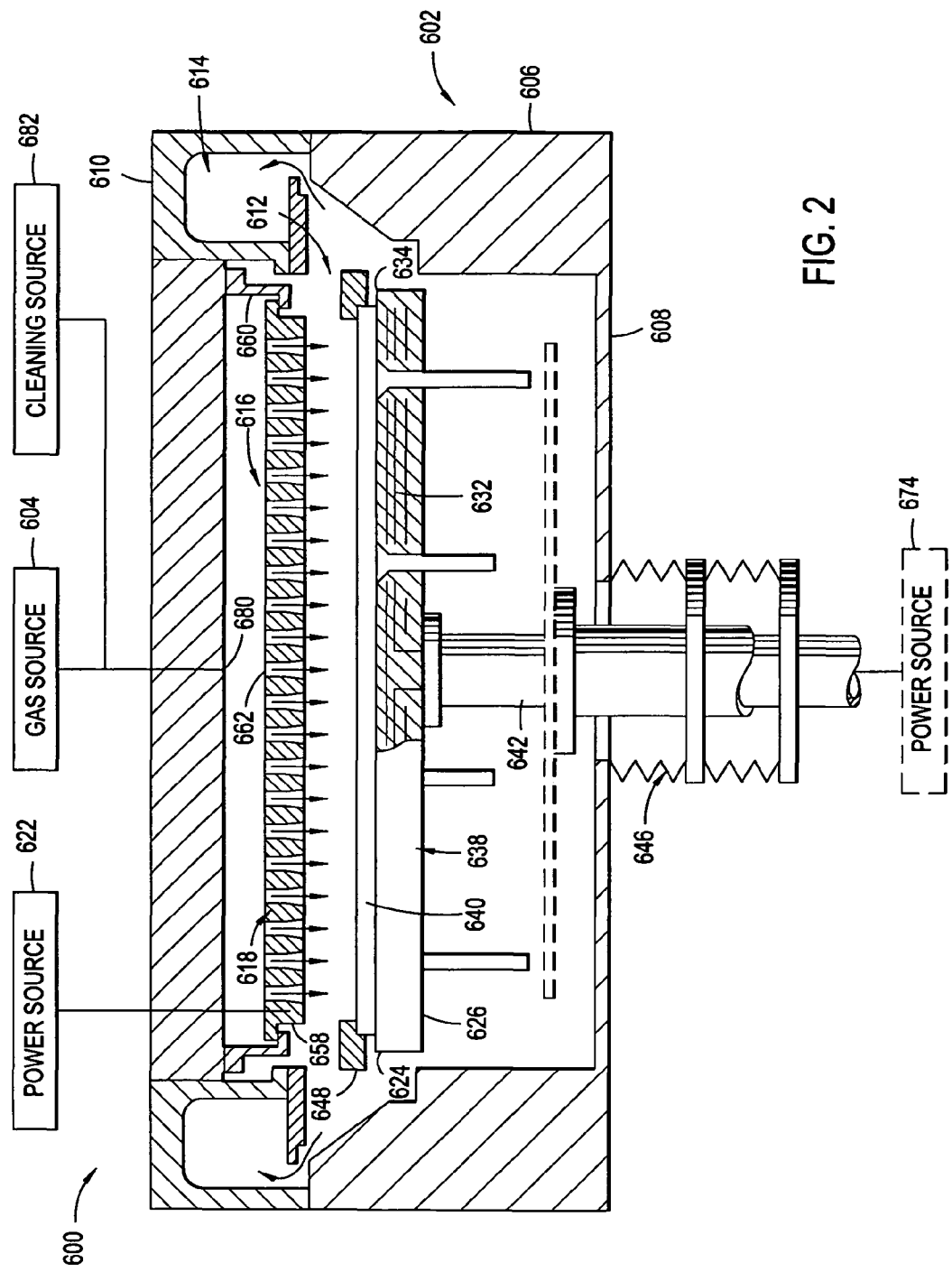
FIG. 2 is a schematic cross-sectional view of one embodiment of a process chamber in accordance with the invention.

FIG. 2 is a schematic cross-sectional view of one embodiment of a plasma enhanced chemical vapor deposition system 600, available from AKT, a division of Applied Materials, Inc., Santa Clara, Calif. The system 600 generally includes a processing chamber 602 coupled to a gas source 604. The processing chamber 602 has walls 606 and a bottom 608 that partially define a process volume 612. The process volume 612 is typically accessed through a port and a valve (not shown) to facilitate movement of a substrate 640 into and out of the processing chamber 602. The walls 606 support a lid assembly 610 that contains a pumping plenum 614 that couples the process volume 612 to an exhaust port (that includes various pumping components, not shown) for exhausting any gases and process by-products out of the processing chamber 602.

A temperature controlled substrate support assembly 638 is centrally disposed within the processing chamber 602. The substrate support assembly 638 supports the substrate 640 during processing. The substrate support assembly 638 comprises an aluminum body 624 that encapsulates at least one embedded heater 632. The heater 632, such as a resistive element, disposed in the substrate support assembly 638, is coupled to an optional power source 674 and controllably heats the support assembly 638 and the substrate 640 positioned thereon to a predetermined temperature.

In one embodiment, the temperature of the heater 632 can be controlled, to be set at about 200° C. or lower, such as between about 100° C. to about 160° C., depending on the deposition processing parameters for the conditioning material being deposited. For example, the heater can be set at about 150° C. for a low temperature deposition process. A heating element and/or a cooling element can be disposed in the substrate support assembly 638 to maintain the substrate 640 at a uniform temperature of 200° C. or lower, such as at about 150° C. Alternatively, the heater 632 can be turned off with only heating/cooling fluid inside the substrate support assembly 638 to control the temperature of the substrate during deposition, resulting in a substrate temperature of about 100° C. or lower for a low temperature deposition process.

The support assembly 638 generally is grounded such that RF power supplied by a power source 622 to a gas distribution plate assembly 618 positioned between the lid assembly 610 and substrate support assembly 638 (or other electrode positioned within or near the lid assembly of the chamber) may excite gases present in the process volume 612 between the support assembly 638 and the gas distribution plate assembly 618. The RF power from the power source 622 is generally selected commensurate with the size of the substrate to drive the chemical vapor deposition process.

A RF power of about 10 W or larger, such as between about 100 W to about 7000 W, is applied to the power source 622 to generate an electric field in the process volume 612. The power source 622 and matching network (not shown) create and sustain a plasma of the process gases from the precursor gases in the process volume 612. Preferably high frequency RF power of 13.56 MHz can be used, but this is not critical and lower frequencies can also be used. Further, the walls of the chamber can be protected by covering with a ceramic material or anodized aluminum material.

Generally, the support assembly 638 has a lower side 626 and an upper side 634, supporting the substrate 640. The lower side 626 has a stem 642 coupled thereto and connected to a lift system (not shown) for moving the support assembly 638 between an elevated processing position (as shown) and a lowered substrate transfer position. The stem 642 additionally provides a conduit for electrical and thermocouple leads between the support assembly 638 and other components of the system 600. A bellows 646 is coupled to the substrate support assembly 638 to provide a vacuum seal between the process volume 612 and the atmosphere outside the processing chamber 602 and facilitate vertical movement of the support assembly 638.

The lift system is adjusted such that a spacing between the substrate and the gas distribution plate assembly 618 is about 400 mils or larger, such as between about 400 mils to about 1600 mils during processing. The ability to adjust the spacing enables the process to be optimized over a wide range of deposition conditions, while maintaining the required film uniformity over the area of a large substrate. The combination of a grounded substrate support assembly, a ceramic liner, high pressures and close spacing gives a high degree of plasma confinement between the gas distribution plate assembly 618 and the substrate support assembly 638, thereby increasing the concentration of reactive species and the deposition rate of the subject thin films.

The support assembly 638 additionally supports a circumscribing shadow frame 648. Generally, the shadow frame 648 prevents deposition at the edge of the substrate 640 and support assembly 638 so that the substrate does not stick to the support assembly 638. The lid assembly 610 typically includes an entry port 680 through which process gases provided by the gas source 604 are introduced into the processing chamber 602. The entry port 680 is also coupled to a cleaning source 682. The cleaning source 682 typically provides a cleaning agent, such as disassociated fluorine, that is introduced into the processing chamber 602 to remove deposition by-products and films from processing chamber hardware, including the gas distribution plate assembly 618.

The gas distribution plate assembly 618 is typically configured to substantially follow the profile of the substrate 640, for example, polygonal for large area substrates and circular for wafers. The gas distribution plate assembly 618 includes a perforated area 616 through which precursors and other gases, such as hydrogen gas, supplied from the gas source 604 are delivered to the process volume 612. The perforated area 616 is configured to provide uniform distribution of gases passing through the gas distribution plate assembly 618 into the processing chamber 602. The gas distribution plate assembly 618 typically includes a diffuser plate 658 suspended from a hanger plate 660. A plurality of gas passages 662 are formed through the diffuser plate 658 to allow a predetermined distribution of gas passing through the gas distribution plate assembly 618 and into the process volume 612.

Gas distribution plates that may be adapted to benefit from the invention are described in commonly assigned U.S. patent application Ser. No. 09/922,219, filed Aug. 8, 2001 by Keller et al.; Ser. No. 10/140,324, filed May 6, 2002; and Ser. No.

10/337,483, filed Jan. 7, 2003 by Blonigan et al.; U.S. Pat. No. 6,477,980, issued Nov. 12, 2002 to White et al.; and U.S. patent application Ser. No. 10/417,592, filed Apr. 16, 2003 by Choi et al., which are hereby incorporated by reference in their entireties.

According to one method of the invention, a substrate is placed in a deposition process chamber. A mixture of precursors for the material layer is delivered into the process chamber. The material layer is deposited onto the substrate by applying an electric field and generating a plasma inside the process chamber. The electric field can be generated by applying a power source, such as radio-frequency power or microwave frequency power, to the process chamber. The power source can be coupled to the process chamber inductively or capacitively. The power used can be varied, depending on what type of the material layer is deposited on the substrate and the surface area of the substrate and the support assembly. In general, a power of between about 100 W to about 1500 W can be used in a system having a substrate receiving surface area of about 2000 cm$^2$ or less. A substrate temperature of about 200° C. or lower, such as between about 100° C. to about 180° C., e.g., at about 150° C., is used. The pressure of the process chamber is maintained at about 0.5 Torr to about 10 Torr, such as at about 0.5 Torr to about 2.5 Torr. The material layer is deposited at a deposition rate of about 100 Å/min or higher, such as about 300 Å/min or higher, or in some cases, about 700 Å/min or higher, e.g., between about 300 Å/min to about 800 Å/min.

Figure 3:
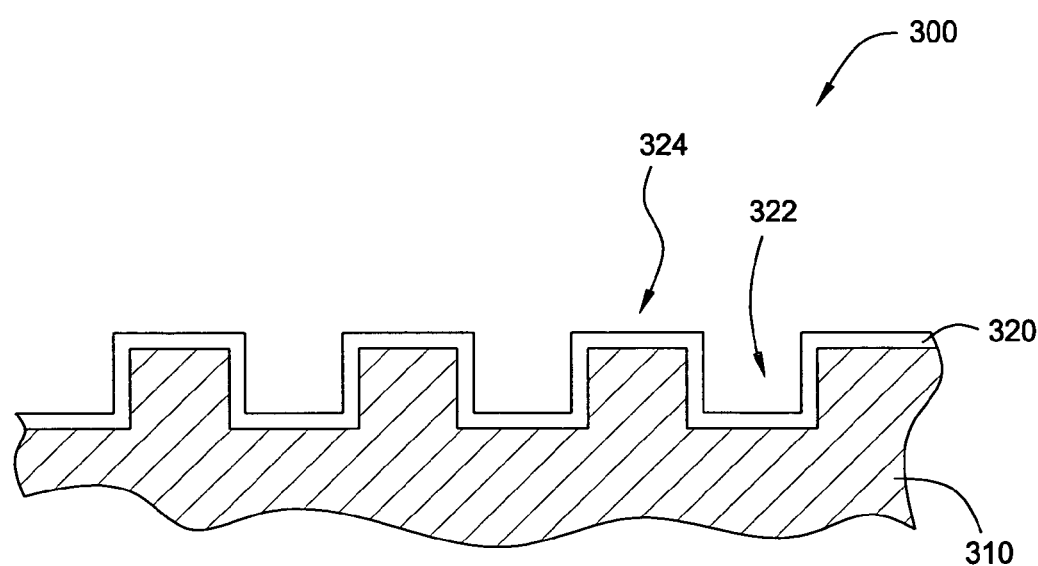
FIG. 3 depicts a cross-sectional schematic view of a substrate with a conditioning material deposited on top in accordance with one embodiment of the invention.

FIG. 3 depicts a cross-sectional schematic view of a substrate 300 with a material layer 320 deposited on top to condition the surface of the substrate 300 in accordance with one embodiment of the invention. For example, the material layer 320 is deposited on a portion of the surface of a substrate material 310, which could be a polymer material, such as various carbon composites containing graphite, a metal-, glass-, plastic-, or silicon-containing material. The thickness of the material layer 320 may be about 100 Å or more, such as in the range of about 200 Å to about 5000 Å.

The material layer 320 can be deposited onto the substrate before or after the substrate 300 is patterned. In one aspect, the material layer 320 is deposited on a patterned substrate having topographical features 322, 324 thereon to provide good step coverage over the features 322, 324 and good uniformity of about 10% or higher over the surface of the substrate (e.g., a uniformity of 700 Å to 900 Å at an average thickness of about 800 Å).

The features 322 and 324 may include openings, lands, contacts, grooves, channels, holes, passages, conduits, etc., and can be patterned by etching, molding, pressing, machining, photolithography and other patterning techniques. Also, the invention provides a method to deposit the material layer 320 on the surface of the substrate 300 with flexible feature sizes. In one aspect of the invention, the material layer 320 can be deposited on both sides of the substrate surface using method of the invention. In some cases, one side of the substrate is conditioned using methods of the invention under a process chamber and then the other side can be treated.

In one aspect, the invention provides a method for treating a surface of a substrate having a high fluid contact angle. The method includes generating a plasma inside the process chamber and depositing a material layer onto a portion of the surface of the substrate to reduce the fluid contact angle of the substrate surface. The fluid contact angle of the substrate surface generally depends on the material of the substrate surface and any treatment on the substrate surface, and is typically measured in reference to water, such as the contact angle or wetting angle, a, by placing a water drop onto the substrate surface. The method of the invention provides treatment of a substrate surface such that the fluid contact angle to water is reduced (becoming more hydrophilic) or the fluid contact angle to an electrolyte of a fuel cell is reduced, especially after exposure to acidic conditions, such as after soaking in a diluted hydrofluoric acid solution for a period of time.

Figure 4A:
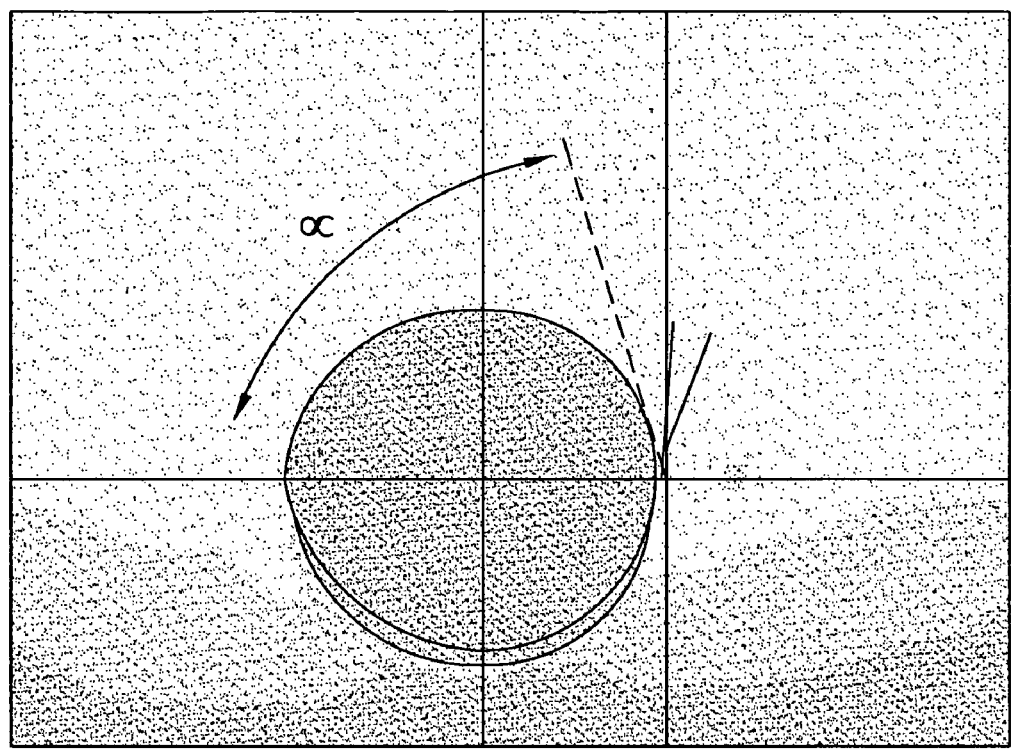
FIG. 4A illustrates the contact angle of the surface of a substrate without surface conditioning.
Figure 4B:
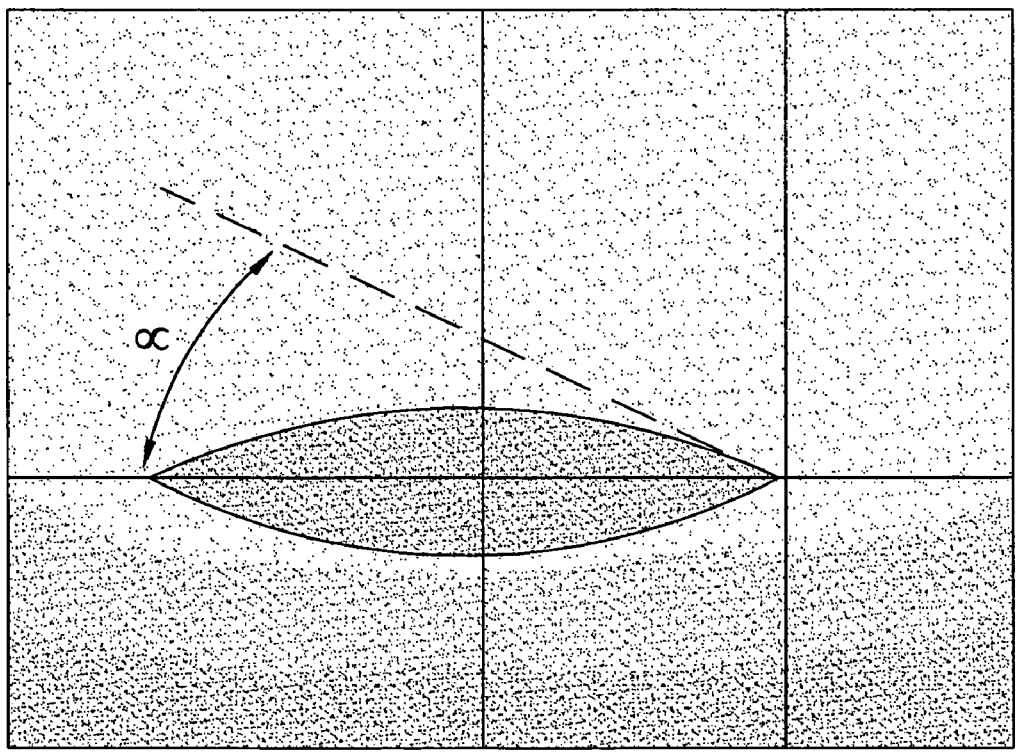
FIG. 4B illustrates the contact angle of a surface of a substrate after surface conditioning in accordance with one embodiment of the invention.
Figure 4C:
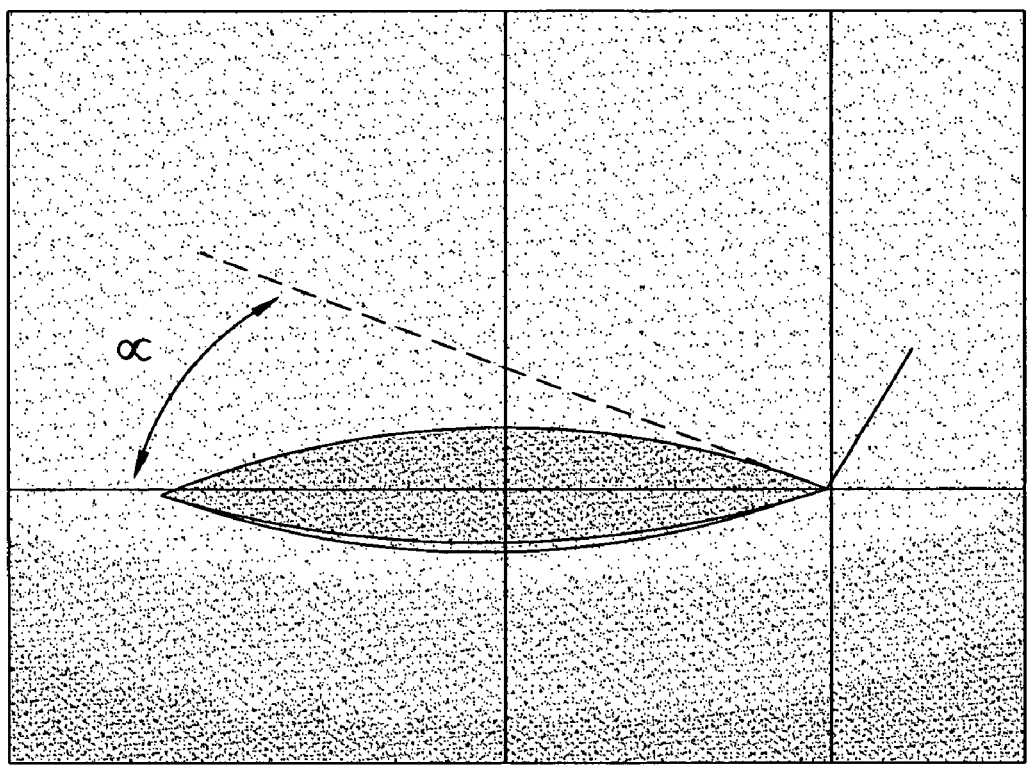
FIG. 4C illustrates the contact angle of a surface of a substrate after surface conditioning in accordance with another embodiment of the invention.

FIG. 4A shows a contact angle α, of a carbon composite substrate after soaking in distilled water for about 113 hours. The contact angle is measured by dropping about 5 µl of distilled water onto the surface and observed under microscope. An initial water contact angle of more than 75°, as shown in FIG. 4A (unconditioned), can be reduced to about 50° or less. One exemplary deposited material, phosphorus doped amorphous silicon, is used to condition the substrate surface, and the results are shown in FIG. 4B (conditioned), demonstrating a water contact angle of about 20° or less. FIG. 4C (conditioned) showed another exemplary deposited material, silicon nitride, having a water contact angle of about 10° or less.

Further, the substrate surface is treated to become resistant to etching and corrosion of an acid. For example, the material layer 320 is used to treat a substrate surface to become resistant to hydrofluoric acid (HF) and other acid solutions, having a pH of less than 7, such as a pH of between about 3 to about 5, e.g., acidic solutions containing $SO_4^{2-}$, $SO_3^-$, $HSO_4^-$, $CO_3^{2-}$, and $HCO_3^-$, etc. For example, the substrate surface is treated to contain a wet etch rate of less than about 0.03 Å/min in the presence of about 10 ppm of hydrofluoric acid in water.

Also, the substrate surface is treated to be conductive to current. For example, the material layer 320 comprises a resistivity of less than about 100 Ω-cm, such as less than about 10 Ω-cm or less than about 1 Ω-cm, on the surface of a carbon composite. At the same time, the deposited material layer adheres well to the substrate and there is no peeling off or swelling for long term stability in acidic conditions. For example, the material layer adheres to surface of the substrate without peeling off after at least about 10 hours in the presence of about 10 ppm of hydrofluoric acid in water, even no peeling off the surface of the substrate after at least about 100 hours in the presence of about 10 ppm of hydrofluoric acid in water.

The material layer 320 can be used to treat a surface of a part useful in a fuel cell such that the surface of the fuel cell part becomes resistant to acid corrosion and contain a wet etch rate of less than about 0.03 Å/min in the presence of about 10 ppm of hydrofluoric acid in water. The material layer is deposited onto the surface of the fuel cell part to reduce the fluid contact angle of the surface of the fuel cell part, making the surface more hydrophilic. In addition, both sides/surfaces of the fuel cell part can be treated/conditioned with the material layer 320 by processing one side at a time or both sides simultaneously.

Exemplary materials of the material layer 320 of the invention include nitride films, silicon films, and phosphorus-doped films deposited in the thickness range of about 1000 Å to about 3500 Å. For example, silicon nitride (SiN), amorphous silicon (a-Si), phosphorus-doped amorphous silicon (n$^+$ a-Si), and microcrystal silicon (mc-Si), among others, can be used as the material layer 320. In one embodiment, the material layer is deposited using precursors including combinations of one or more of a silicon-containing gas, a nitrogen-containing gas, a phosphorus-containing gas, and a hydrogen-containing gas.

The precursors may include a silicon-containing precursor, such as silane (SiH4), $Si_2H_6$, $SiF_4$, among others, for depositing a layer of amorphous silicon, microcrystal silicon, phosphorus-doped amorphous silicon and silicon nitride, among others, to be deposited onto the substrate. The silicon-containing precursor can be delivered, for example, at a flow rate of 10 sccm or larger, such as between about 100 sccm to about 500 sccm for a substrate size of about 50 mm×about 50 mm or larger.

The precursors may further include a nitrogen-containing precursor, including, but not limited to, ammonia ($NH_3$), nitrous oxide ($N_2O$), nitric oxide (NO), nitrogen ($N_2$), and combinations thereof. The nitrogen-containing precursor can be delivered at a flow rate of about 5 sccm or larger, such as between about 100 sccm to about 6000 sccm for various nitrogen-containing precursors.

The precursors may further include a hydrogen-containing precursor, including, but not limited to, ammonia ($NH_3$), hydrogen gas ($H_2$), and combinations thereof. The hydrogen-containing precursor can be delivered at a flow rate of about 100 sccm or larger, such as between about 400 sccm to about 4000 sccm for various hydrogen-containing precursors.

The precursors may further include a phosphorus-containing precursor, including, phosphine ($PH_3$) and others. The phosphorus-containing precursor is used to dope a small amount of phosphorus into the deposited material layer and can be delivered at a flow rate of about 10 sccm or larger, such as between about 100 sccm to about 3000 sccm.

For example, a mixture of the precursors may include silane, ammonia, and nitrogen, among others, for depositing a silicon nitride film. The inventors have found that incorporating a hydrogen gas for depositing a silicon nitride film provide good surface properties to the substrate surface, especially on a surface of a carbon composite. Hydrogen gas can be used at a high flow rate of more than about 500 sccm, such as about 4500 sccm or more, e.g., at about 5000 sccm, to improve the adhesion of a silicon nitride film to the substrate surface, as compared to no hydrogen gas used, such that the deposited silicon nitride film does not peel off or swell on the substrate surface even after exposure to an acidic solution (e.g., hydrofluoric acid) for a long time. Thus, a hydrogen gas is delivered into the process chamber to improve surface properties and water contact performance of a silicon nitride layer.

Alternatively, silane, hydrogen gas and phosphine, among others are used for depositing a phosphorus-doped silicon film, such as a phosphorus-doped amorphous silicon film and a microcrystal silicon film. Each precursor can be delivered at different or the same flow rate, depending on various deposition parameters required. The inventors have found that, in one embodiment of the invention, a high flow rate of hydrogen gas ($H_2$) at about 1000 sccm or more, such as about 4500 sccm or more, is useful for depositing a microcrystal silicon film with good adhesion to a substrate surface, low resistivity, low fluid contact angle, and low acid wet etch rate.

In another embodiment, a low flow rate of phosphine ($PH_3$) at about 2000 sccm or less, such as about 500 sccm or less, is useful for depositing a phosphorus-doped amorphous silicon film with good surface properties. Thus, the introduction of the hydrogen gas at low flow rate is found to reduce the resistivity of the phosphorus-doped amorphous silicon film deposited on the substrate, such as from a measurement of about $1.0 \times 10^3$ $\Omega$-cm being reduced to about less than 100 $\Omega$-cm, preferably about 10 $\Omega$-cm or lower, most preferably about 1 $\Omega$-cm or lower.

EXAMPLE 1

Substrates were brought under vacuum inside a chamber of a conventional parallel-plate radio-frequency (RF) plasma enhanced chemical vapor deposition (PECVD) system, AKT 1600 PECVD, available from Applied Materials, Inc., Santa Clara, Calif. with a spacing of about 900 mils to about 1000 mils. The temperature of the substrate support (susceptor) was set at about 150° C. for a low temperature deposition process.

Mixtures of silane ($SiH_4$), ammonia ($NH_3$), nitrogen ($N_2$) in the presence of a hydrogen gas ($H_2$) were delivered into the chamber as the source precursor gases for depositing a silicon nitride film to condition a carbon composite. As a comparison, prior art methods of using silane ($SiH_4$), ammonia ($NH_3$), and a nitrogen ($N_2$) for depositing silicon nitride was prepared in parallel under the same process conditions. The pressure inside the chamber was about 1 Torr. A plasma was sustained with RF power generator set at about 13.56 MHz and about 900 W.

Basic film properties were compared for films prepared from both process conditions. The results showed that silicon nitride films deposited in the presence and absence of hydrogen source gas exhibit similar basic film properties and comparable deposition rate for both films at about 600 Å/min to about 1500 Å/min. Thus, the presence of hydrogen gas does not affect basic film properties or the deposition rate.

However, adhesion to a substrate surface, film resistivity, fluid contact angle (wetting angle), and acid wet etch rate for both films varied dramatically. The silicon nitride film deposited without hydrogen source gas peeled off the substrate surface easily. Resistivity was reduced form about $1.0 \times 10^9$ $\Omega$-cm to about 100 $\Omega$-cm or less, such as about 1 $\Omega$-cm or less, and wet etch rate is improved from more than about 5000 Å/min to less than about 2000 Å/min in buffered-oxide-etchant (BOE, 6:1) and from about 0.030 Å/min or more to about 0.025 Å/min or less in about 10 ppm hydrofluoric acid solution.

EXAMPLE 2

Substrates were brought under vacuum inside a plasma enhanced chemical vapor deposition (PECVD) system, AKT 1600 PECVD, available from Applied Materials, Inc., Santa Clara, Calif. with a spacing of about 900 mils to about 1000 mils. The temperature of the substrate support (susceptor) was set at about 150° C. for a low temperature deposition process.

Mixtures of silane ($SiH_4$), phosphine ($PH_3$), in the presence of hydrogen gas ($H_2$) were delivered into the chamber as the source precursor gases for depositing a phosphorus-doped amorphous silicon film to condition a carbon composite. The pressure inside the chamber is about 0.7 Torr. A plasma was sustained with RF power generator set at about 13.56 MHz and about 250 W.

The results showed that the phosphorus doped amorphous silicon film deposited good surface properties with good adhesion to a substrate surface, low resistivity, low fluid contact angle (wetting angle), and low acid wet etch rate. The phosphorus doped amorphous silicon film deposited adheres well to the substrate and did not peel off the substrate surface even after soaking in about 10 ppm of a hydrofluoric acid solution for about 120 hours. Resistivity was very low, less than about 1 $\Omega$-cm, and thus a good conductor on the carbon composite substrate. Acid wet etch rate is extremely good, showing no etching in buffered-oxide-etchant (BOE, 6:1) and in about 10 ppm hydrofluoric acid solution, and thus the film is extremely stable in acidic conditions.

Although the invention has been described in accordance with certain embodiments and examples, the invention is not meant to be limited thereto. The CVD process herein can be carried out using other CVD chambers, adjusting the gas flow rates, pressure and temperature so as to obtain high quality films at practical deposition rates. It is understood that embodiments of the invention include scaling up or scaling down any of the process parameter/variables as described herein according to substrate sizes, chamber conditions, etc., among others.

While the foregoing is directed to embodiments of the present invention, other and further embodiments of the invention may be devised without departing from the basic scope thereof, and the scope thereof is determined by the claims that follow.

The invention claimed is:

1. A method for treating a surface of a substrate useful in a fuel cell, comprising:
   placing the substrate in a process chamber, the surface of the substrate having a first fluid contact angle and comprising a carbon composite material;
   generating a plasma inside the process chamber; and
   depositing a material layer onto a portion of the surface of the substrate from a mixture of precursors for the material layer to reduce the first fluid contact angle, wherein the material layer comprises a material selected from the group consisting of silicon nitride, amorphous silicon, phosphorus doped amorphous silicon, microcrystal silicon, and combinations thereof, a surface of the material layer has a second fluid contact angle smaller than the first fluid contact angle, and the material layer has a wet etch rate of less than about 0.03 Å/min in the presence of about 10 ppm of hydrofluoric acid in water.

2. The method of claim 1, wherein the surface of the material layer has a fluid contact angle of less than 50° in the presence of a water drop.

3. The method of claim 1, wherein the material layer has a resistivity of less than about 10 Ω-cm on the surface of the substrate comprising the carbon composite material.

4. The method of claim 1, wherein the material layer is deposited to the surface of the substrate after substrate is patterned.

5. The method of claim 1, wherein the precursors for the material layer are selected from the group consisting of silane ($SiH_4$), hydrogen gas ($H_2$), ammonia ($NH_3$), phosphine ($PH_3$), nitrogen gas ($N_2$), and combinations thereof.

6. The method of claim 1, wherein the material layer is a phosphorus doped amorphous silicon layer deposited using a silicon-containing gas, a phosphorus-containing gas, and hydrogen gas ($H_2$) as precursors, and the phosphorus-containing gas is at a low flow rate of about 1000 sccm or less.

7. The method of claim 1, wherein the material layer is a silicon nitride layer deposited using a silicon-containing gas, a nitrogen-containing gas, and hyfrogen gas ($H_2$) as precursors.

8. The method of claim 1, wherein the precursors for the material layer comprise a silicon-containing gas selected from the group consisting of silane, $SiF_4$, $Si_2H_6$ and combinations thereof.

9. The method of claim 1, wherein the precursors for the material layer comprise a nitrogen-containing gas selected from the group consisting of nitrogen gas ($N_2$), ammonia ($NH_3$), nitrous oxide ($N_2O$), nitric oxide (NO), and combinations thereof.

10. The method of claim 1, wherein the precursors for the material layer comprise a hydrogen-containing gas selected from the group consisting of silane ($SiH_4$), hydrogen gas ($H_2$), ammonia ($NH_3$), phosphine ($PH_3$), and combinations thereof.

11. The method of claim 1, wherein the precursors for the material layer comprise a phosphorus-containing gas at a low flow rate of about 500 sccm or less.

12. The method of claim 1, wherein the precursors for the material layer comprise hydrogen gas at a high flow rate of about 4500 sccm or more.

13. The method of claim 1, wherein the material layer adheres to surface of the substrate after at least about 10 hours in the presence of about 10 ppm of hydrofluoric acid in water.

14. The method of claim 1, wherein the temperature of the substrate inside the process chamber is maintained at a substrate temperature of about 200° C. or lower.

15. The method of claim 1, wherein the substrate is selected from the group consisting of a fuel cell part, a conductive plate, a separator plate, a bipolar plate, an end plate, and combinations thereof.

16. A method for treating a surface of a substrate useful in a fuel cell, comprising:
   placing the substrate in a processing chamber; and
   reducing a fluid contact angle of the surface of the substrate by depositing a material layer over the surface of the substrate, wherein the surface of the substrate has a first fluid contact angle, a surface of the material layer has a second fluid contact angle smaller than the first fluid angle, and the material layer comprises a material selected from the group consisting of silicon nitride, amorphous silicon, phosphorus doped amorphous silicon, microcrystal silicon, and combinations thereof.

17. The method of claim 16, wherein the material layer has a wet etch rate of less than about 0.03 Å/min in the presence of about 10 ppm of hydrofluoric acid in water.

18. The method of claim 17, wherein depositing the material layer comprises:
   flowing a precursor mixture into the processing chamber, wherein the precursor mixture comprises a silicon-containing precursor, one of a nitrogen-containing precursor or a phosphorus-containing precursor, and a hydrogen-containing precursor; and
   generating a plasma from the precursor mixture to deposit the material layer on the surface of the substrate.

19. The method of claim 18, wherein the hydrogen-containing precursor is hydrogen gas ($H_2$), and depositing the material layer further comprises increasing the flow rate of hydrogen gas to improve adhesion between the material layer and the surface of the substrate.

20. The method of claim 19, wherein the flowing a precursor mixture comprises flowing the hydrogen gas at a flow rate of about 4500 sccm or more.

21. The method of claim 17, wherein the substrate comprises a carbon-composite material, and the first fluid contact angle is more than 75°.

22. The method of claim 21, wherein the material layer comprises phosphorous doped amorphous silicon having a resistivity of less than about 10 Ω-cm, and the second fluid contact angle is about 20° or less.

23. The method of claim 22, wherein the depositing the material layer comprises:
   flowing a precursor mixture into the processing chamber, wherein the precursor comprises silane ($SiH_4$), phosphine ($PH_3$) and hydrogen gas ($H_2$); and
   generating a plasma from the precursor mixture to deposit the material layer on the surface of the substrate.

24. The method of claim 23, wherein the depositing the material layer further comprises increasing the flow rate of hydrogen gas to improve adhesion between the material layer and the surface of the substrate.

25. The method of claim 21, wherein the material layer comprises silicon nitride having a resistivity of less than about 10 Ω-cm, and the second fluid contact angle is about 10° or less.

26. The method of claim 25, wherein the depositing the material layer comprises:
flowing a precursor mixture into the processing chamber, wherein the precursor comprises silane ($SiH_4$), ammonia ($NH_3$), nitrogen ($N_2$) and hydrogen gas ($H_2$); and
generating a plasma from the precursor mixture to deposit the material layer on the surface of the substrate.

27. The method of claim 26, wherein the depositing the material layer further comprises increasing the flow rate of hydrogen gas to improve adhesion between the material layer and the surface of the substrate.

28. The method of claim 17, wherein the material layer has a thickness of about 1000 Å to about 3500 Å.

29. The method of claim 16, further comprising:
patterning the substrate to form topographical features on the surface of the substrate prior to depositing the material layer.

30. The method of claim 16, further comprising treating a second surface of the substrate by depositing the material layer on the second surface.

* * * * *

UNITED STATES PATENT AND TRADEMARK OFFICE
CERTIFICATE OF CORRECTION

PATENT NO. : 7,959,987 B2  
APPLICATION NO. : 11/292225  
DATED : June 14, 2011  
INVENTOR(S) : Won et al.

Page 1 of 1

It is certified that error appears in the above-identified patent and that said Letters Patent is hereby corrected as shown below:

In the Detailed Description:

Column 9, Line 67, please delete the first "a" and insert --α-- therefor;

In the Claims:

Column 13, Claim 4, Line 39, please insert --the-- after after;

Column 13, Claim 7, Line 52, please delete "hyfrogen" and insert --hydrogen-- therefor.

Signed and Sealed this
Thirteenth Day of September, 2011

David J. Kappos
*Director of the United States Patent and Trademark Office*